United States Patent
Mowry et al.

(10) Patent No.: US 6,313,611 B1
(45) Date of Patent: Nov. 6, 2001

(54) LOW POWER INDICATION CIRCUIT FOR LEAD ACID BATTERY PACK

(75) Inventors: Michael R. Mowry; Thomas P. Becker, both of Kenosha, WI (US)

(73) Assignee: Snap-on Technologies, Inc., Lincolnshire, IL (US)

( * ) Notice: Subject to any disclaimer, the term of this patent is extended or adjusted under 35 U.S.C. 154(b) by 0 days.

(21) Appl. No.: 09/578,536

(22) Filed: May 24, 2000

Related U.S. Application Data

(60) Provisional application No. 60/137,638, filed on Jun. 4, 1999.

(51) Int. Cl.[7] .................................................. H02J 7/00
(52) U.S. Cl. ............................ 320/136; 320/132; 320/162
(58) Field of Search .................................... 320/132, 134, 320/136, 162

(56) References Cited

U.S. PATENT DOCUMENTS

| | | |
|---|---|---|
| 4,020,414 | 4/1977 | Paredes . |
| 5,321,392 | 6/1994 | Skakoon et al. . |
| 5,343,351 | 8/1994 | Quantz . |
| 5,530,336 * | 6/1996 | Eguchi et al. ......................... 320/118 |
| 5,545,935 | 8/1996 | Stewart . |
| 5,547,775 | 8/1996 | Eguchi et al. . |
| 5,569,550 | 10/1996 | Garrett et al. . |
| 5,582,928 | 12/1996 | Farley . |
| 5,625,272 | 4/1997 | Takahashi . |
| 5,661,463 | 8/1997 | Letchak et al. . |
| 5,664,636 | 9/1997 | Ikuma et al. . |
| 5,703,464 | 12/1997 | Karunasiri et al. . |
| 5,721,482 | 2/1998 | Benvegar et al. . |
| 5,747,189 | 5/1998 | Perkins . |
| 6,060,863 * | 5/2000 | Sakarai et al. ......................... 320/126 |
| 6,118,253 * | 9/2000 | Mukainakano et al. .............. 320/134 |
| 6,163,131 * | 12/2000 | Gartstein et al. ....................... 320/118 |
| 6,259,227 * | 7/2001 | Gherman et al. ....................... 320/101 |

* cited by examiner

Primary Examiner—Peter S. Wong
Assistant Examiner—Gregory J. Toatley, Jr.
(74) Attorney, Agent, or Firm—Seyfarth Shaw

(57) ABSTRACT

A lead-acid battery pack has an electronically-controlled power switch connected in series with the battery. A voltage monitor/controller is connected in series with a normally-open ON/OFF switch across the battery, the controller controlling a ramped pulse width modulator which provides a switch control signal to the power switch. The controller is program controlled so that, a fraction of a second after the ON/OFF switch is closed, the modulator will provide a constant DC level control signal to the power switch to hold it closed. If the battery voltage drops below a first level for several seconds, the modulator will produce a PWM switch control signal of gradually decreasing pulse width and duty cycle until the power switch is permanently open. This gradual decrease of power delivered from the battery will occur immediately upon the battery voltage dropping below a second level lower than the first level.

19 Claims, 2 Drawing Sheets

LOW POWER INDICATION CIRCUIT FOR LEAD ACID BATTERY PACK

RELATED APPLICATION

This application claims the benefit of the filing date of copending U.S. Provisional Application No. 60/137,638, filed Jun. 4, 1999.

BACKGROUND

The present application relates to battery packs of the type usable with cordless power tools and, in particular, to lead-acid battery packs. The application relates in particular to techniques for protecting against deep discharge of lead-acid battery packs.

Cordless power tools commonly use a NiCad battery pack to power an electric motor. Such tools are commonly used until the battery pack is completely discharged, since NiCad cells can tolerate deep discharges and, in some circumstances, are actually revived by deep discharge/charge cycling. Furthermore, the discharge of a NiCad battery is apparent to the user, since, as the battery approaches deep discharge, the power deliverable by the tool is reduced until, eventually, the tool will stop working.

It is also known to utilize lead-acid batteries in various devices because such batteries afford certain power delivery advantages. Such lead-acid batteries, of a size suitable for use in cordless power tool battery packs, are sold by Bolder Technologies under the designation "Bolder 9/5 sub-C TMF" (Thin Metal Film). However, unlike NiCad batteries, lead-acid batteries do not tolerate deep discharges. Discharge of lead-acid batteries below about 50% state-of-charge adversely affects battery life and could cause permanent damage. Thus, to ensure maximum battery life, such batteries should not be discharged below about 50% state-of-charge. Furthermore, when such lead-acid batteries are utilized in battery packs for cordless power tools, the discharge of the battery to about 50% state-of-charge may not be readily apparent to the user, since the battery can still deliver substantial power at such state-of-charge levels. Thus, the user may easily discharge the battery to below 50% state-of-charge without knowing that he is doing so.

SUMMARY

There is disclosed below an improved battery pack circuit usable with lead-acid batteries, which avoids the disadvantages of prior battery pack circuits while affording additional structural and operating advantages.

An important feature is the provision of a control apparatus for a device powered by a battery pack, which prevents use of the device when the battery of a battery pack is discharged below a predetermined state-of-charge level.

Another feature is the provision of an apparatus of the type set forth, which applies a gradual reduction of output power when the state-of-charge of the battery of a battery pack drops below a predetermined level.

Another feature is the provision of an apparatus of the type set forth which provides a clear indication to a user of the device when the state-of-charge of the battery of a battery pack drops below a predetermined level.

In connection with the foregoing features, another feature is the provision of an apparatus of the type set forth, which provides indication and/or shutdown functions when the state-of-charge of the battery of a battery pack remains below a predetermined level for a predetermined time period.

Another feature is the provision of a deep discharge protection circuit for a lead-acid battery pack.

In connection with the foregoing feature, another feature is the provision of a deep discharge protection circuit of the type set forth which simulates the function and feel of a discharged NiCad battery.

BRIEF DESCRIPTION OF THE DRAWINGS

For the purpose of facilitating an understanding of the subject matter sought to be protected, there are illustrated in the accompanying drawings embodiments thereof, from an inspection of which, when considered in connection with the following description, the subject matter sought to be protected, its construction and operation, and many of its advantages should be readily understood and appreciated.

DETAILED DESCRIPTION

Figure 1:
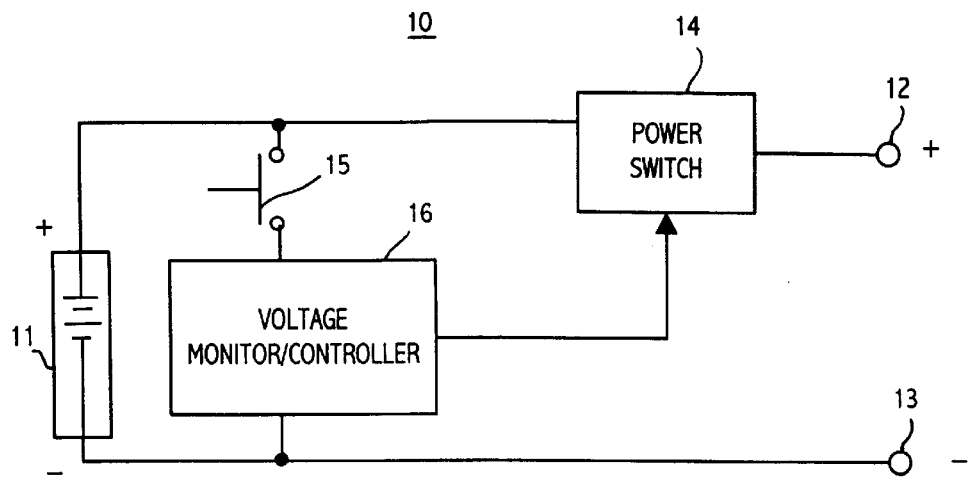
FIG. 1 is a functional block diagram of a battery pack control circuit in accordance with a first embodiment.

Referring to FIG. 1, there is illustrated a battery pack control circuit, generally designated by the numeral 10, constructed in accordance with and embodying the features of the present invention. The circuit 10 includes a battery pack 11 connected to output terminals 12, 13 through a power switch 14. It will be appreciated that the output terminals 12, 13 are adapted to be coupled to an associated device, such as an electric motor of an associated cordless power tool (not shown). Connected in series across the battery pack 11 are a manually-operated trigger switch 15 and a voltage monitor/controller 16. The voltage monitor/controller 16 has an output which is coupled to a control terminal of the power switch 14. The battery pack 11 may include a lead-acid battery pack, having one or more cells, which may be the Bolder battery described above, or similar batteries. The power switch 14 may comprise a bank of MOSFET power devices, which provide compact size, lower power drain, suitably low insertion resistance and solid-state reliability. However, it will be appreciated that the power switch function could also be implemented using a suitable mechanical relay or other solid state power devices capable of handling the required currents and voltages. The trigger switch 15 is normally open, so that the voltage monitor/controller 16 is powered only when the trigger switch 15 is closed, to conserve energy. The voltage monitor/controller 16 may be a microcontroller, which operates under stored program control and functions to measure the terminal voltage of the battery pack 11, establish certain time intervals and generate output signals for controlling the power switch 14 in a manner to be described more fully below. The use of a microcontroller minimizes component count, affords low power dissipation and provides the ability to be reprogrammed to accommodate different tool sizes and power ranges. However, it will be appreciated that the functions of the voltage monitor/controller 16 could also be implemented using numerous analog and/or digital electronic hardware configurations, such as voltage comparators, timers and logic elements.

In operation, it will be appreciated that, when the trigger switch 15 is closed, the voltage monitor/controller 16 is powered to output a signal for closing the power switch 14 and delivering power to the associated device. When the terminal voltage of the battery pack 11 drops to a predetermined level, or remains at a predetermined level for a predetermined time period, this condition is sensed by the voltage monitor/controller 16, which opens the power switch 14, resulting in immediate shutdown of the associated power tool.

Figure 2:
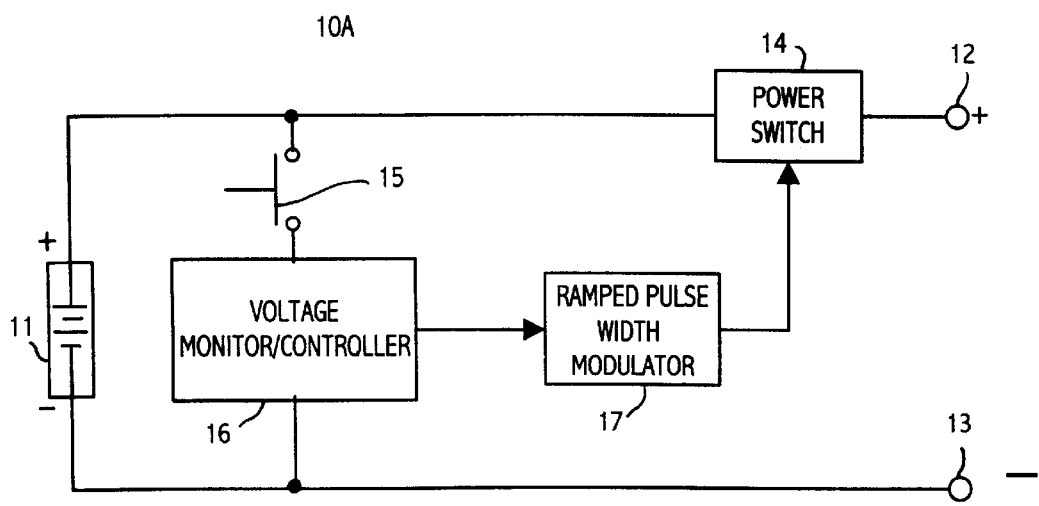
FIG. 2 is a block diagram similar to FIG. 1 showing a second embodiment of the control circuit.

While this effectively protects the battery pack 11 from deep discharge, the sudden shutdown of the tool would be alien to the operator and might be misinterpreted as a product failure. Accordingly, there is illustrated in FIG. 2 an alternative embodiment of the control circuit, generally designated by the numeral 10A, which is substantially the same as the circuit of FIG. 1, except that there is added a ramped pulse width modulator 17 connected between the output of the voltage monitor controller 16 and the control input of the power switch 14. The purpose of the pulse width modulator 17 is to provide a gradual transition of the power switch 14 from a fully closed condition to a fully open condition, resulting in gradual reduction of power delivered to the associated tool.

Figure 3:
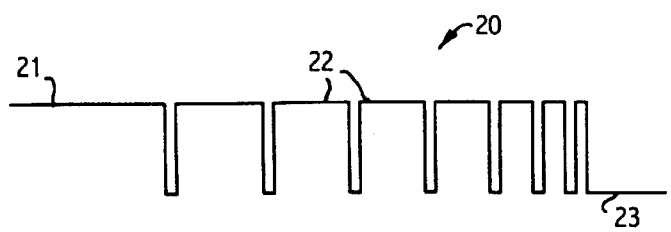
FIG. 3 is a diagram of the waveform of the output signal from the ramped pulse width modulator of FIG. 2.

Referring now to FIG. 3, there is illustrated a waveform 20 of the type generated by the ramped pulse width modulator 17. Normally, the ramped pulse width modulator 17 outputs a continuous DC signal, as at 21, to maintain the power switch 14 continuously closed at a maximum power condition. When the battery voltage drops below a predetermined level, under conditions as determined by the algorithm of the voltage monitor/controller 16, the ramped pulse width modulator 17 is switched to a pulse-width-modulation condition to output a series of generally rectangular pulses 22 of gradually decreasing width and duty cycle. This gradually reduces the ON time of the power switch 14, reducing the effective output power delivered to the terminals 12, 13 until, eventually, the output signal 20 from the ramped pulse width generator 17 reaches a zero duty cycle or a continuously OFF condition 23 for maintaining the power switch 14 permanently open. The gradual reduction of power to the associated tool effected by the pulse width modulator 17, simulates the approach of complete discharge of a NiCad battery, with which the operator is familiar. Thus, the operator will interpret the power reduction as an indication that the battery has become discharged to the point where it requires recharging, although in reality it will only have reached a partially discharged state, typically about 50% discharged.

While, for purposes of illustration, only a few cycles of the output pulses of the pulse width modulator 17 are illustrated, it will be appreciated that, in the typical application, the gradual shutdown of the motor will take place over a much longer time period, perhaps involving several hundred or more pulses. Also, while a modulation scheme utilizing continuously reducing duty cycle pulses is illustrated, other modulation patterns could be utilized, depending upon the particular application.

Typically, the device connected to the circuit 10 is a cordless power tool, such as an impact tool, power screwdriver or the like. For such applications, the battery pack 11 may typically include a lead-acid battery with six cells connected in series. In such an arrangement, the battery pack 11 exhibits a nominal no-load voltage of approximately 12.6 volts. At about 50% state-of-charge level the no-load terminal voltage will drop to about 12.0 volts. It is known that terminal voltage will drop under normal use depending on the load on the battery pack 11. For example, the motor may draw a very heavy current when power is first turned on, whereas, during run-down of a fastener, the power tool motor will draw a particular design current. Fully charged, the battery pack 11 would likely maintain a voltage level above 12.0 volts during such brief periods of heavy current draw. However, a weaker, aged or more discharged battery might momentarily fall below the predetermined minimum level, causing the controller to shut down the motor prematurely. Also, during the impact or pulse cycle of an impact tool, heavier currents will be drawn that may bring even a fully charged battery pack below 12.0 volts which, also, could cause an undesired shutdown of the tool. In direct-driven power tools, such as electric screwdrivers or nut drivers, the tools are typically driven to a stall condition. Stall currents will almost certainly reduce the battery voltage to less than 12.0 volts, causing the controller to shut down the motor. In this case, shutdown of the motor might be desirable.

Various control schemes may be implemented to correct for undesired motor shutdowns while providing for desired motor shutdowns. Thus, a combination of voltage level trip points and time periods can be programmed into the algorithm of the voltage monitor/controller 16. An initial time delay before voltage monitoring would mask the momentary dip in terminal voltage due to initial motor turn-on. To resolve the motor load for a weak, aged or less than fully charged battery pack, a second voltage level for an extended period of time might determine the shutdown trip point. For heavy or stall loads, a third voltage level at any time might cause immediate shutdown.

Significantly, all of these elements may be implemented in the program algorithm for a particular application. Thus, in the example given above for a cordless impact tool, at power-on its motor may draw about 20 amps for approximately 0.1 second. During rundown (output shaft turning, but no impacting) the motor draws approximately 5 amps. During impacting the motor draws approximately 15 amps. At 50% state-of-charge or above, a healthy battery pack exhibits a minimum terminal voltage of 12.0 volts at no-load, 11.6 volts at 5 amps and 10.5 volts at 15 amps. Given the above product operating parameters, the control algorithm for the voltage monitor/controller 16 may delay sensing at power-on for 0.2 seconds, thus ignoring the high current draw at power on. If the battery voltage thereafter drops below 11.6 volts for more than a second predetermined time, e.g., 5 seconds (longer than most fastener installation periods), or drops below 10.5 volts at any time after the initial 0.2 second time period, the controller calls for shut down of the tool motor.

Figure 4:
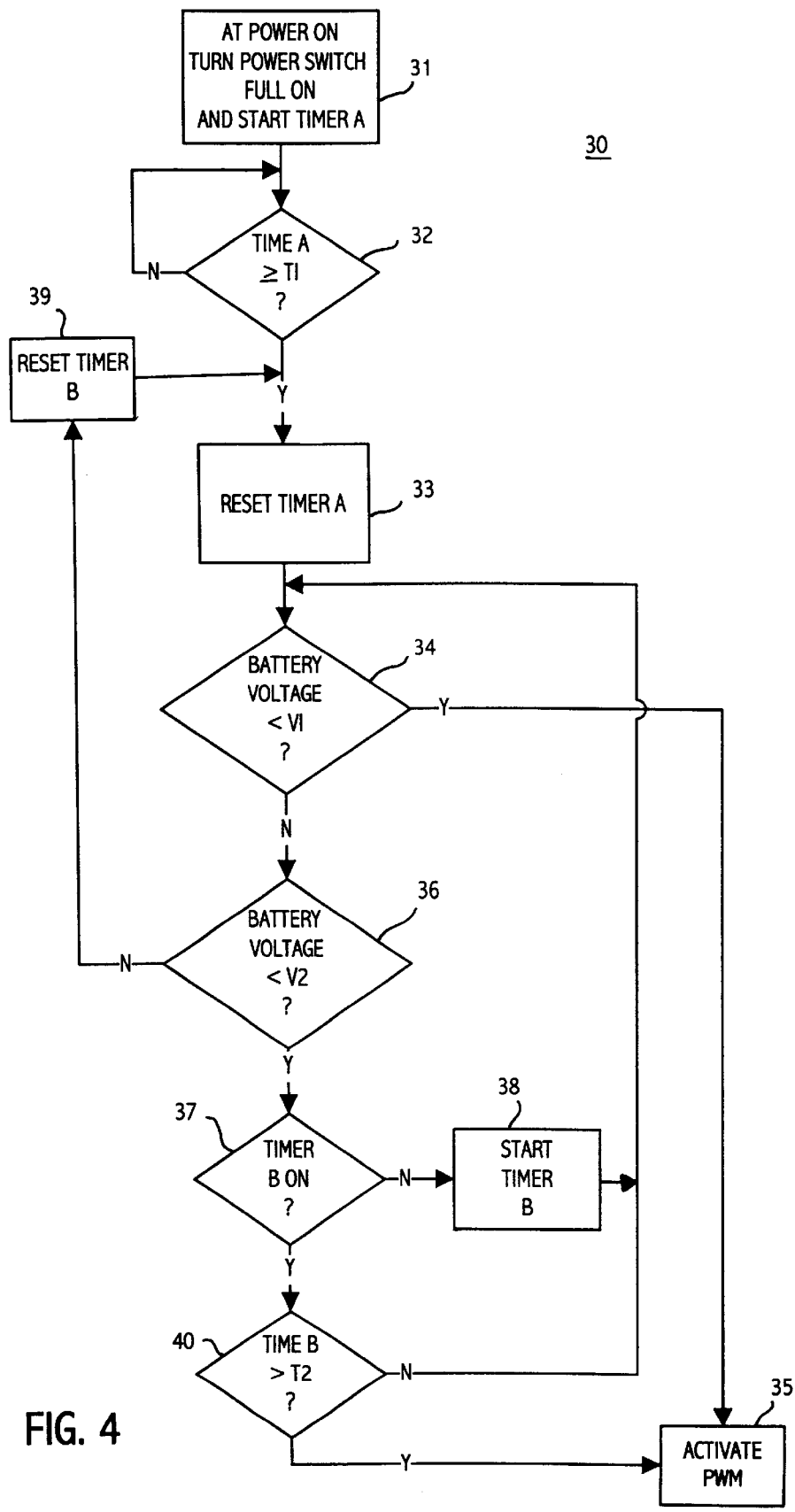
FIG. 4 is a flow chart of a software algorithm of the type which may be utilized for programmed control of the voltage monitor/controller of FIG. 2.

Referring to FIG. 4, there is illustrated a flow chart 30 of such an algorithm. At 31, at power on the routine turns the power switch 14 full on and starts a timer A. Then, at 32, the routine checks to see if the time A is greater than or equal to a predetermined time period T1 (0.2 seconds in the illustrated embodiment). If not, it returns to 32 and continues to monitor the timer. When the timer reaches time T1, the routine then, at 33, resets timer A and then, at 34, measures the battery voltage and checks to see if it is less than a first predetermined voltage level V1 (10.5 volts in the illustrated embodiment). If it is, the routine immediately activates the pulse width modulated output of the modulator 17 at 35. Otherwise, the routine next checks at 36 to see if the battery voltage is below a second predetermined voltage V2 (11.6 volts in the illustrated embodiment). If so, the routine checks at 37 to see if timer B is on and, if not, it starts the timer B at 38 and then returns to 34. If, at 36, the battery voltage has not dropped below voltage V2, the routine resets timer B at 39 and returns to 33. If, at 37, timer B is already on, the routine next checks at 40 to see if the time B is greater than a predetermined time period T2 (5 seconds in the illustrated embodiment) and, if not, returns to 34 to continue monitoring. If the timer B has timed out at 40, indicating that the voltage has stayed below V2 for time period T2, the routine again activates the pulse width modulated mode of the modulator 17 at 35. The routine continues in this manner as long as the trigger switch 15 is closed.

It will be appreciated that other algorithms could also be utilized, depending upon the particular application involved.

The matter set forth in the foregoing description and accompanying drawings is offered by way of illustration only and not as a limitation. While particular embodiments have been shown and described, it will be obvious to those skilled in the art that changes and modifications may be made without departing from the broader aspects of applicants' contribution. The actual scope of the protection sought is intended to be defined in the following claims when viewed in their proper perspective based in the prior art.

We claim:

1. A battery pack comprising:

a battery having at least one cell having a positive terminal and a negative terminal, an electronically controlled power switch coupled in series with the battery and having a control input for controlling operation of the switch between a full power delivery condition and a zero power delivery condition, and a control circuit connected across the battery and having an output coupled to the control input of the power switch and generating at the output a switch control signal, the control circuit including a processor and a normally-open selective ON/OFF switch connected in series across the battery, the processor operating under control of a stored program for monitoring battery voltage and for shifting the switch control signal from a normal state, which holds the power switch in its full power delivery condition, to a modulated state, which gradually shifts the power switch from its full power delivery condition to its zero power delivery condition, the program including a routine which delays monitoring of the battery voltage for a predetermined time period after closure of the ON/OFF switch.

2. The battery pack of claim 1, wherein the battery includes plural cells connected in series.

3. The battery pack of claim 1, wherein the battery is a lead-acid battery.

4. The battery pack of claim 1, wherein the processor is a microcontroller.

5. The battery pack of claim 4, wherein the predetermined routine delays generation of the switch control signal for the predetermined time period after closure of the ON/OFF switch.

6. The battery pack of claim 5, wherein the predetermined time period is less than one second.

7. The battery pack of claim 1, wherein the switch control signal in its modulated state is a pulsating signal.

8. The battery pack of claim 7, wherein the control circuit includes a ramped pulse width modulator connected between the processor and the power switch and generating the switch control signal so that, in its normal state, the switch control signal is a constant predetermined DC voltage level and, in its modulated state, is a pulse-width modulated signal of gradually decreasing pulse width and pulse duty cycle.

9. A battery pack comprising:

a positive terminal and a negative terminal, a battery having at least one cell and coupled to the positive and negative terminals, a control circuit connected to the battery and to the positive and negative terminals and monitoring battery voltage level, the control circuit including a processor operating under control of a stored program for controlling power flow from the battery to the terminals between a full power delivery condition and a zero power delivery condition, the program including a routine for controlling shifting from the full power delivery condition to the zero power delivery condition when battery voltage drops below a predetermined level and remains below that level for a predetermined time period.

10. The battery pack of claim 9, wherein the battery includes plural cells connected in series.

11. The battery pack of claim 9, wherein the battery is a lead-acid battery.

12. The battery pack of claim 9, wherein the predetermined time period is a first time period, the control circuit including a normally-open ON/OFF switch connected in series with the processor across the battery, the program routine including a portion delaying monitoring of battery voltage for a predetermined second time period after closure of the ON/OFF switch.

13. The battery pack of claim 12, wherein the first time period is several seconds and the second time period is less than one second.

14. The battery pack of claim 9, wherein the predetermined level is a first level, the program routine including a portion for controlling shifting from the full power delivery condition to the zero power delivery condition immediately upon the battery voltage dropping below a predetermined second level lower than the first level.

15. The battery pack of claim 9, wherein the control circuit includes means for shifting gradually from the full-power delivery condition to the zero power delivery condition.

16. The battery pack of claim 15, and further comprising an electronically-controlled power switch coupled in series between the battery and the positive terminal and having a control input for controlling operation of the switch between the full power delivery condition and the zero power delivery condition, the control circuit including a ramped pulse width modulator connected between the processor and the control input of the power switch and degenerating a switch control signal, the switch control signal being a constant predetermined DC voltage level in the full power delivery condition and, in the zero power delivery condition, being a pulse-width-modulated signal of gradually decreasing pulse width and pulse duty cycle.

17. A method of indicating that a lead-acid battery is in need of recharge, comprising:

connecting the battery to a load, then waiting a predetermined time period and then monitoring battery voltage while the battery is connected to a load, and gradually reducing power delivered from the battery to the load when the battery voltage is below a predetermined level as an indication to the user of low battery charge state.

18. The method of claim 17, wherein the predetermined level is a first level, the gradual reduction of power beginning only after the battery voltage has been at the first level for a predetermined time period, and further comprising immediately beginning gradual reduction of power delivery upon the battery voltage reaching a second predetermined level lower than the first level.

19. The method of claim 17, wherein the gradual reduction of power is accomplished by pulse-width-modulation of the power.

* * * * *